US012569884B2

(12) United States Patent
Hope et al.

(10) Patent No.: US 12,569,884 B2
(45) Date of Patent: Mar. 10, 2026

(54) ACOUSTIC TRANSDUCER AND METHOD OF MANUFACTURING

(71) Applicant: DarkVision Technologies Inc, North Vancouver (CA)

(72) Inventors: Jay Hope, Vancouver (CA); Graham Manders, North Vancouver (CA); Connor Vandenberg, Vancouver (CA); Jacob William Rose, Burnaby (CA)

(73) Assignee: DarkVision Technologies Inc

( * ) Notice: Subject to any disclaimer, the term of this patent is extended or adjusted under 35 U.S.C. 154(b) by 997 days.

(21) Appl. No.: 17/765,841

(22) PCT Filed: Oct. 13, 2020

(86) PCT No.: PCT/IB2020/059611
§ 371 (c)(1),
(2) Date: Apr. 1, 2022

(87) PCT Pub. No.: WO2021/074792
PCT Pub. Date: Apr. 22, 2021

(65) Prior Publication Data
US 2022/0339670 A1 Oct. 27, 2022

(30) Foreign Application Priority Data
Oct. 17, 2019 (GB) ..................................... 1915002

(51) Int. Cl.
| | |
|---|---|
| *B06B 1/06* | (2006.01) |
| *H03H 3/08* | (2006.01) |
| *E21B 47/002* | (2012.01) |

(52) U.S. Cl.
CPC ............. *B06B 1/0692* (2013.01); *H03H 3/08* (2013.01); *B06B 2201/73* (2013.01); *E21B 47/0025* (2020.05)

(58) Field of Classification Search
CPC ............................ B06B 1/0692; B06B 1/0688
See application file for complete search history.

(56) References Cited

U.S. PATENT DOCUMENTS

| | | | |
|---|---|---|---|
| 3,952,387 | A | 4/1976 | Iinuma et al. |
| 4,611,141 | A | 9/1986 | Hamada et al. |
| | | (Continued) | |

FOREIGN PATENT DOCUMENTS

| | | |
|---|---|---|
| CA | 3092535 A1 | 9/2019 |
| CN | 1882197 A | 12/2006 |
| | (Continued) | |

OTHER PUBLICATIONS

Combined Search and Examination Report under Sections 17 and 18(3) received for GB Application No. GB1915002.8, mailed on Dec. 5, 2019, 7 Pages.

(Continued)

*Primary Examiner* — Bryan P Gordon

(57) ABSTRACT

An acoustic transducer array and method of making same. A first metal layer is deposited on a first side of a piezoelectric composite to form a common electrode and a second metal layer is provided over the obverse side. Portions of the second metal layer are removed to create a plurality of individual electrodes. A third metal layer may be deposited onto the plurality of individual electrodes, the third metal layer being thicker than the second metal layer. The individual electrodes extend beyond the piezoelectric composite in the elevation direction to create electrode leads. Metal layers may be provided by lithography, a wireframe or a foil sheet.

10 Claims, 12 Drawing Sheets

(56) References Cited

U.S. PATENT DOCUMENTS

| | | | | |
|---|---|---|---|---|
| 5,755,909 | A | * 5/1998 | Gailus | H10N 30/87 |
| | | | | 29/25.35 |
| 2005/0000279 | A1 | 1/2005 | Yogeswaren | |
| 2005/0122004 | A1* | 6/2005 | Shibamoto | B06B 1/0622 |
| | | | | 310/334 |
| 2011/0257532 | A1* | 10/2011 | Sasaki | B06B 1/064 |
| | | | | 29/25.35 |
| 2017/0156695 | A1* | 6/2017 | Nakamura | A61B 8/4236 |
| 2017/0285153 | A1* | 10/2017 | Sato | G01S 7/52004 |
| 2019/0123260 | A1 | 4/2019 | Kakamu | |
| 2020/0147644 | A1* | 5/2020 | Chang | B06B 1/0666 |

FOREIGN PATENT DOCUMENTS

| | | | |
|---|---|---|---|
| CN | 101203765 | A | 6/2008 |
| CN | 102331574 | A | 1/2012 |
| DE | 3808017 | A1 | 9/1989 |
| EP | 0040374 | A1 | 11/1981 |
| EP | 0694338 | A2 | 1/1996 |
| EP | 0796669 | A2 | 9/1997 |
| EP | 1145772 | A2 | 10/2001 |
| JP | H08307996 | A | 11/1996 |
| JP | H10136491 | A | 5/1998 |
| JP | 2001223556 | A | 8/2001 |
| JP | 2001340340 | A | 12/2001 |
| JP | 2007013944 | A | 1/2007 |
| JP | 2008022887 | A | 2/2008 |
| JP | 2009089738 | A | 4/2009 |
| JP | 2010233224 | A | 10/2010 |
| JP | 6261820 | B2 | 1/2018 |
| WO | 9421388 | A1 | 9/1994 |

OTHER PUBLICATIONS

International Preliminary Report on Patentability received for PCT Application No. PCT/IB2020/059611, mailed on Apr. 28, 2022, 6 Pages.

International Search Report and Written Opinion received for PCT Application No. PCT/IB2020/059611, mailed on Dec. 29, 2020, 7 pages.

* cited by examiner

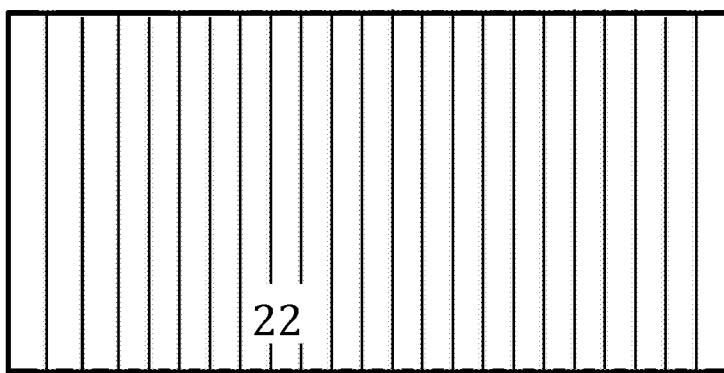
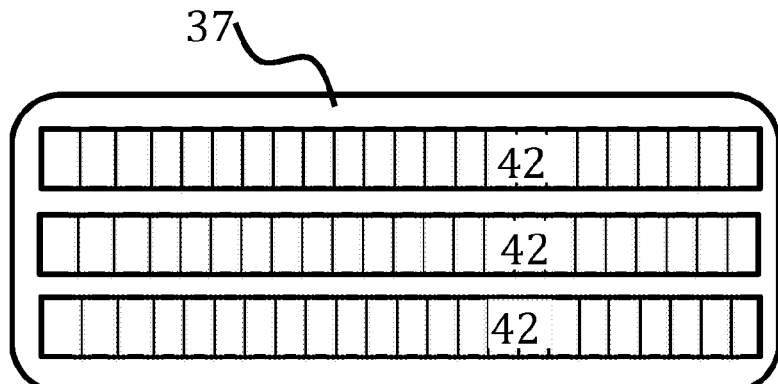
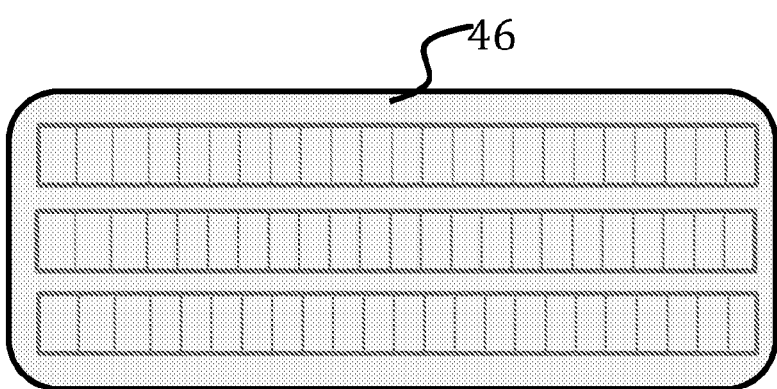
Fig. 4A

24

27

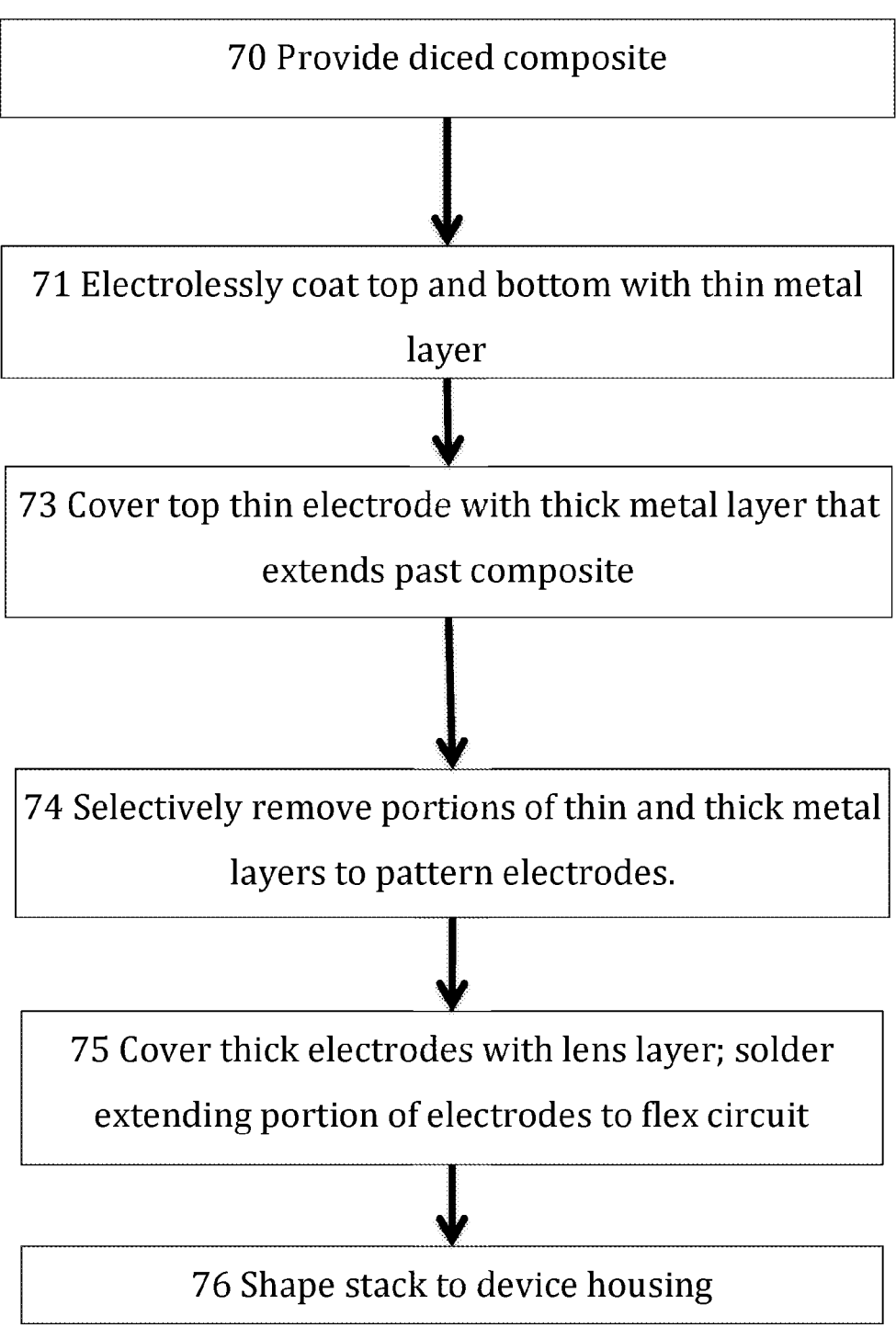

70 Provide diced composite

71 Electrolessly coat top and bottom with thin metal layer

73 Cover top thin electrode with thick metal layer that extends past composite

74 Selectively remove portions of thin and thick metal layers to pattern electrodes.

75 Cover thick electrodes with lens layer; solder extending portion of electrodes to flex circuit 76 Shape stack to device housing

ACOUSTIC TRANSDUCER AND METHOD OF MANUFACTURING

RELATED APPLICATIONS

This application is a national phase of PCT/IB2020/059611, filed on Oct. 13, 2020, which claims priority to United Kingdom Application No. GB1915002.8, filed on Oct. 17, 2019, the disclosure of which are incorporated herein by reference in their entireties.

FIELD OF THE INVENTION

The present disclosure relates to acoustic transducers, in particular to piezoelectric transducers, which may be incorporated into imaging probes for medical examination and non-destructive inspection of structures such as pipes, wells, or manufactured parts

BACKGROUND OF THE INVENTION

Piezoelectric transducers are often used in non-destructive testing (NDT) and inspection of objects and structures by sonifying said object or structure with acoustic waves transmitted by the transducer and receiving acoustic reflections from the surface features and internal features. The received reflections are converted to electrical signal by the transducer, which signals are them processed by an acoustic image processor.

Ultrasonic transducers enable the inspection at higher resolution (sub mm) by interrogating the object features with shorter wavelengths. Arrays of tens or hundreds of transducer elements may be manufactured together. There are many ways of making acoustic transducers. Patent application US20050000279A1 to Schlumberger entitled "Acoustic sensor for downhole measurement tool" discloses one manufacturing method.

FIG. 2 shows a known transducer stack, whereby a single PZT/epoxy composite slab 22 is coated on top and bottom sides with thin gold layers 23, 25. Individual electrodes are defined by dicing thru the top gold layer 25 and then soldering leads 24 to each electrode with solder 29.

Once the transducer stack has been made, electrical leads must be soldered to the electrodes. This leads to deficiencies with transducers formed this way. The fine spacing of elements and leads in high resolution arrays makes it difficult to work them and increases the chances of shorts between neighboring elements. The solder 29 and lead-covering of the piezo creates anomalies in the transmitter or received signals. The heat used in soldering to the transducer can affect the piezoelectric effect when it exceeds the Curie temperature. The present inventors have also observed that operating in certain hostile environments, such as high temperature, high pressure and chemical presence can lead to cracking at the solder joint.

SUMMARY OF THE INVENTION

In accordance with a first aspect of the invention, there is provided a method of manufacturing an array of acoustic transducers comprising: depositing a first metal layer on a first side of a piezoelectric composite to form a common electrode; providing a support structure adjacent the piezoelectric composite substrate on sides of the composite perpendicular to the first side; using photolithography to deposit a second metal layer over the support structure and a second side of the piezoelectric composite, opposite the first side;

selectively removing portions of the second metal layer to create a plurality of individual electrodes; depositing a third metal layer onto the plurality of individual electrodes, wherein the third metal layer is thicker than the second metal layer and extends beyond the piezoelectric composite [in a lengthwise direction of the element] to create electrode leads; and separating the support structure from a transducer stack comprised of the piezoelectric composite and metal layers.

In accordance with a second aspect of the invention, there is provided a method of manufacturing an array of acoustic transducers comprising: providing a piezoelectric composite substrate; depositing a first metal layer on a first side of the piezoelectric composite substrate to form a common electrode; depositing a second metal layer to a second side of piezoelectric composite, opposite the first side; covering and connecting the second metal layer with a third metal layer, wherein the third metal layer is thicker than the second metal layer and extends beyond the piezoelectric composite [in the widthwise direction of the composite]; and removing portions of the second and third metal layers to create a plurality of separate electrodes.

The methods may be used to make at least two arrays in a single batch by providing at least two separate substrates or a substrate sized for at least two arrays and then depositing and forming thick electrodes extending beyond the substrates.

In accordance with a third aspect of the invention, there is provided an acoustic transducer array comprising: a piezoelectric composite; a first metal layer on a first side of the piezoelectric composite defining a common electrode; a second metal layer on a second side of piezoelectric composite, opposite the first side; a second metal layer connected to the first metal layer and extending beyond the piezoelectric composite, wherein the second metal layer is thicker than the first metal layer; and wherein the metal layers are formed to define a plurality of individual electrodes.

Therefore it is possible to create more robust transducer able to withstand high temperatures and pressures.

BRIEF DESCRIPTION OF THE DRAWINGS

Various objects, features and advantages of the invention will be apparent from the following description of embodiments of the invention, as illustrated in the accompanying drawings. The drawings are not necessarily to scale, emphasis instead being placed upon illustrating the principles of various embodiments of the invention.

FIG. 4A is a plan view of transducers at various initial stages of lithography.

FIG. 9 is a flowchart for making a transducer array.

Similar reference numerals indicate similar components having the following key:

Figure 1:
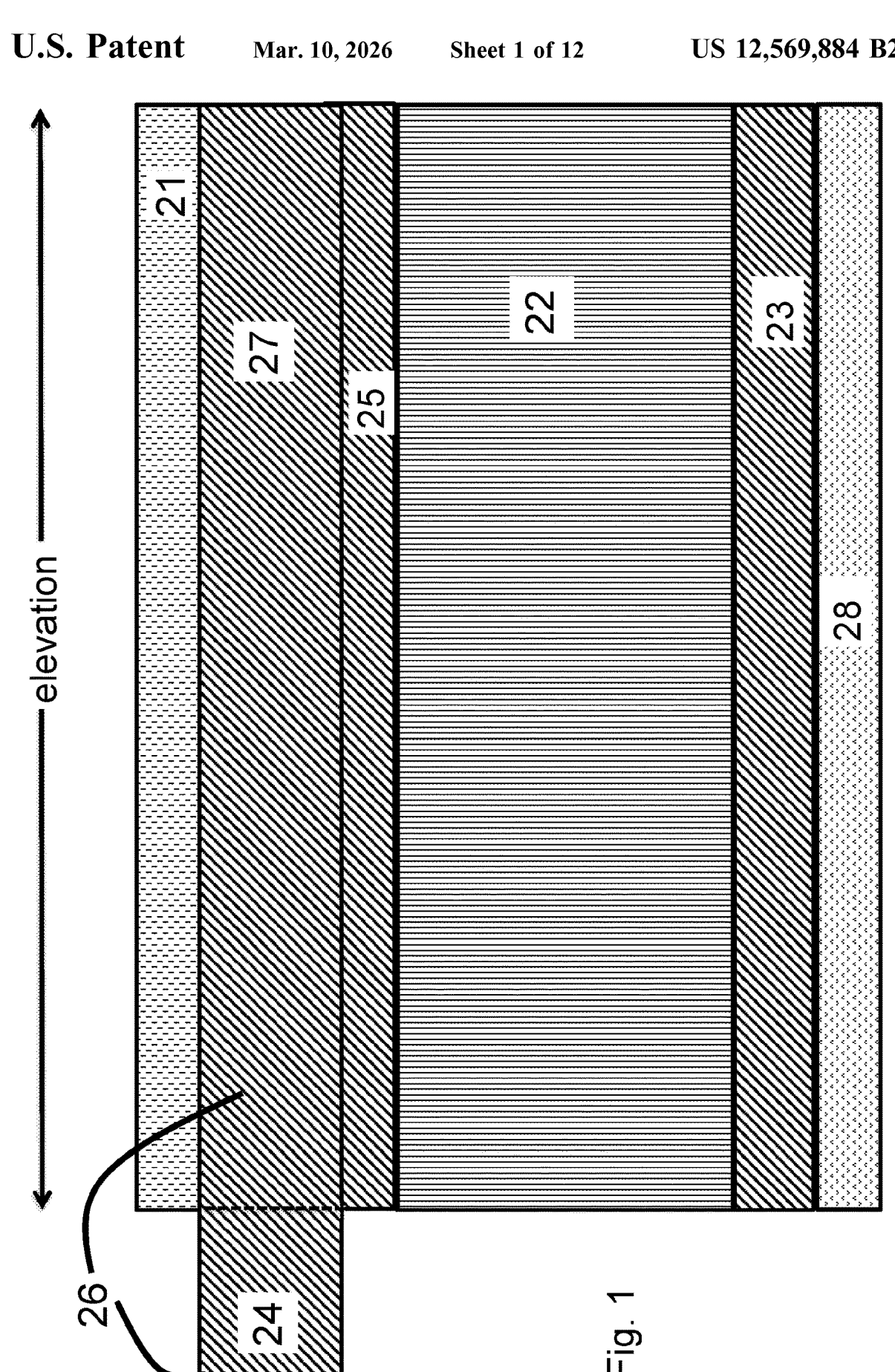
FIG. 1 is a cross-sectional view of a transducer stack according to a preferred embodiment.

2 surface to be investigated;
10 device;
11 scanline;
12 acoustic transducer array;
15 frustoconical mount;
21 matching layer;
22 piezoelectric composite;
23 common electrode;
24 extending/lead portion;
25 thin electrode;
26 thick electrode;
27 electrode portion;
28 backing layer;
29 solder;
30 wireframe;
37 support structure;
42 diced piezoelectric composite;
43 photo resist;
44 UV mask;
45 etched areas
46 cured photo resist
47 thin metal seed layer;
48 thick metal electroplate layer;
49 backbone/support frame;
51 metal foil
53 cutting line
54 (conductive) adhesive
55 laser
59 dicing saw

DETAILED DESCRIPTION

With reference to the figures, preferred embodiments for an acoustic transducer, their composition and construction are described. The transducer comprises a plurality of transducer elements, arranged as a one-dimensional array. Individual electrodes over each transducer element extend as a continuous layer past the underlying piezoelectric composite to electrically and mechanically connect with wires from a drive circuit. Individual electrode may be a single thick metal layer or comprise at least two metal layers (seed layer(s) and thick metal layer(s)).

In addition to other layers common to an acoustic stack, manufacturing comprises combining various techniques for adding metal layers and then selectively removing portions to form individual electrodes for the elements, portions of which extend beyond the piezoelectric composite. Some methods use a support structure to deposit layers.
Transducer Array The frequency of the acoustic waves generated by the transducer 12 is generally in the range of 200 kHz to 30 MHz, and may be designed based on several factors, including the fluid types, velocities in the well, and the speed at which the imaging device is moving. In most uses, the wave frequency is ultrasonic, operating between 1 and 10 MHz.

Higher frequencies (shorter wavelengths) are able to discriminate finer features on the surface by returning distinct reflections from each feature.

The number of individual elements in the transducer array affects the resolution of the generated images. Typically, each transducer array is made up of 32 to 2048 elements, preferably 128 to 1024 elements. The use of a relatively large number of elements generates a fine resolution image of the object. Circuits to drive and capture these arrays are also commonly available.

Figure 2:
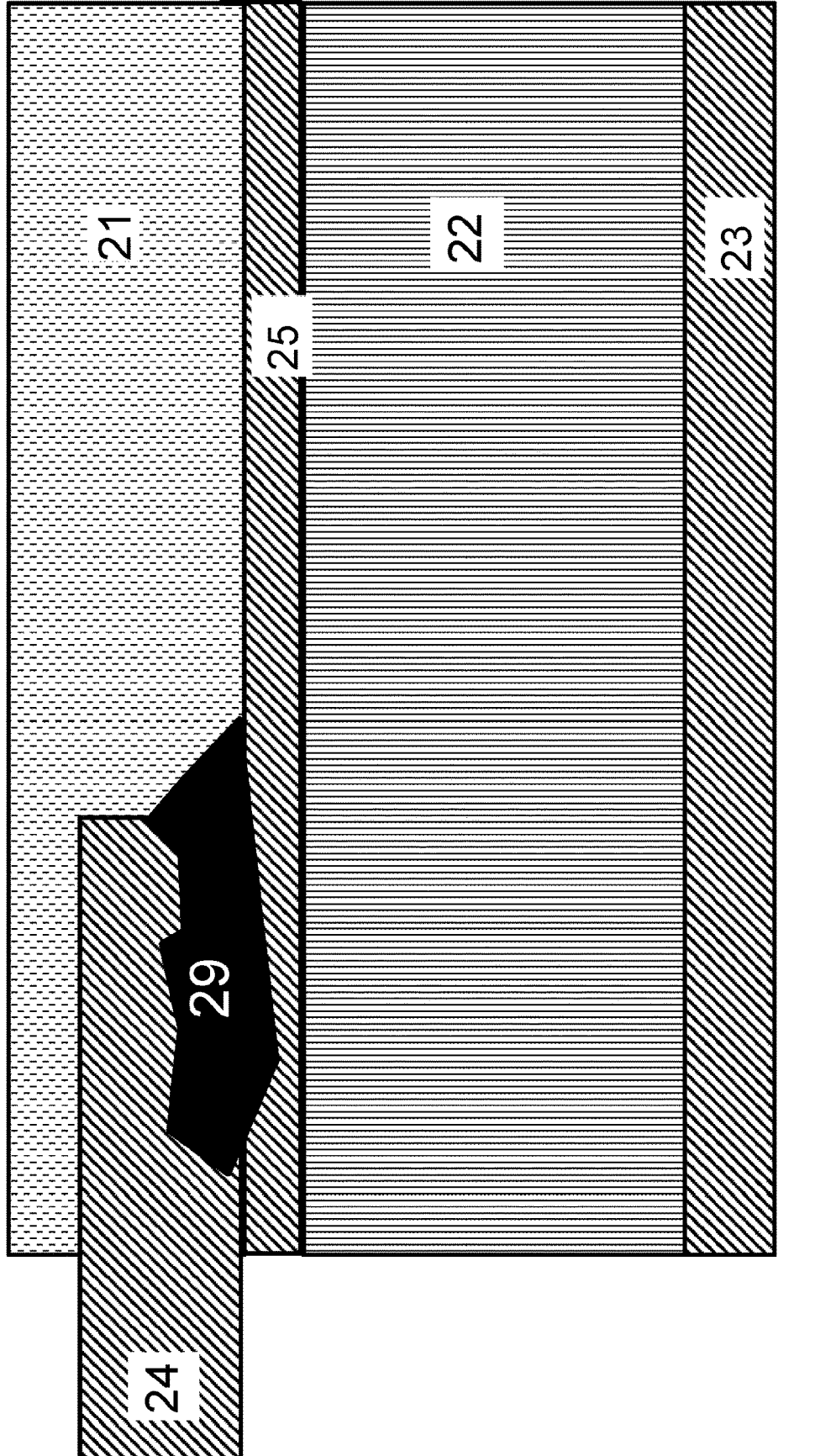
FIG. 2 is a cross-sectional view of a transducer stack according to prior art devices.

FIG. 2 is a side view of an exemplary transducer stack, made according to known methods, comprising common electrode 23, piezoelectric composite slab 22, top electrode 20, and matching layer 21. An electrical lead 24 is attached to the top electrode 25 by solder 29 so that the element can be individually activated. The portion of the element near the solder 29 and lead 24 will emit acoustic anomalies due to irregular geometry and lost piezoelectric effect where the soldering has exceeded the Currie temperature.

Thus in preferred transducers and manufacturing methods, the electrode is placed substantially continuously across the elevation of the element, extending past the piezoelectric substrate in the elevation direction. Connections to leads by soldering or clamping thus take place away from the piezoelectric area. Preferably the Extending Portion 24 extends past the composite in the elevation direction of the transducer by at least 2 mm.

FIG. 1 shows a side view of a transducer stack for a single element, where an array of elements would extend into the page. Piezoelectric composite 22 is covered on a first major surface with a conductive material acting as a common electrode 23 for the array. The opposing, second surface is covered on a per element basis with a second conductive material to form addressable (thin) electrodes 25. These electrodes activate the piezoelectric posts in composite 22 to vibrate generally perpendicular to both the first and second surfaces.

Either of the electrode surfaces may be designated the transmit surface within the probe, designed to face objects to the investigated, while the other electrode surface is designated the back. A backing layer 28 may be connected to this back side, providing structure and acoustic damping to the transducer and/or adhesion to fix the transducer to the probe. Backing layer 28 may be a conductive (e.g. tungsten-impregnated epoxy) or non-conductive (e.g. glass-filled PEEK).

A matching layer 21 covers the transmit surface and is preferably designed to have an acoustic impedance value that is the geometric mean of the lens and composite and of a thickness of one quarter of the design wavelength of the transducer. This is intended to enable the acoustic wave to transmit through the matching layer with maximum energy and minimal artefacts. The matching layer may be epoxy with Al2O3 filling.

As an example, the stack may comprise: a composite 0.3 mm thick; a backing layer 10 mm thick; a sputtered thin electrode 0.6 micron thick; and a thick electrode of 15 to 40 micron thick.

For brevity, we assume the composite 22 is provided as a plate made of piezoelectric posts diced thru the thickness of the plate, surrounded by a matrix of a softer material, such as epoxy, as is currently commercially available. This ensures that the resultant vibration of all post acts normal to the major surface of the plate. The composite may be a 2-2 or 1-3 PZT, commonly available.

The stack of FIG. 1 additionally comprises a thick conductive layer 26 in electrical contact with or part of the thin electrode layer 25. Thus the full electrode for each element is comprised of a first thin layer 25 and second thicker layer 26. In general, the layer 26 is at least an order of magnitude thicker than layer 25. Both layers extend across the elevation of each transducer element so as to activate the underlying piezoelectric material, and layer 26 extends past the piezoelectric composite, generally continuing in the direction of the elevation dimension to form lead portion 24.

Layers 25 and 26 are made from conductive material, generally metals, and may be the same material. Good choices for these materials include gold, chromium, silver, copper and nickel. The selection may be driven by the cost of the material and manufacturability at a given steps of the process, as described below.

General Manufacture

Similar to known methods, the present transducer array is built-up in layers, removing areas of a layer where that material is not desired. FIG. 4A illustrates the initial stages of manufacture starting with a piezoelectric composite plate 22, ground flat on both major surfaces. Because the plate is typically quite wide, relative to a single array, plural strips 42 of the composite are diced (step 2) and then placed spaced-apart onto a base, preferably held in place and separated by a temporary, sacrificial support 37 (step 3). The support material may be a wax, metal, epoxy or a plastic frame. The support structure may have voids therein to hold the composite strips. The support material not only holds the strips in place but provides a way of accepting metal atoms and supporting the electrode layer, where it extends beyond the composite strips. The support structure may be a material that is placed adjacent to or molded around the composite and then ground with the composite to make them coplanar.

In alternative embodiments, the piezoelectric composite strips 42 are wider than needed for the transducer in active use. This extra 'sacrificial' portion provides the support for accepting and supporting the metal layer(s) 25 and/or 26, and the 'sacrificial' portion is machined away towards the end of the manufacturing process to reveal the extending portion 24.

Figure 4B:
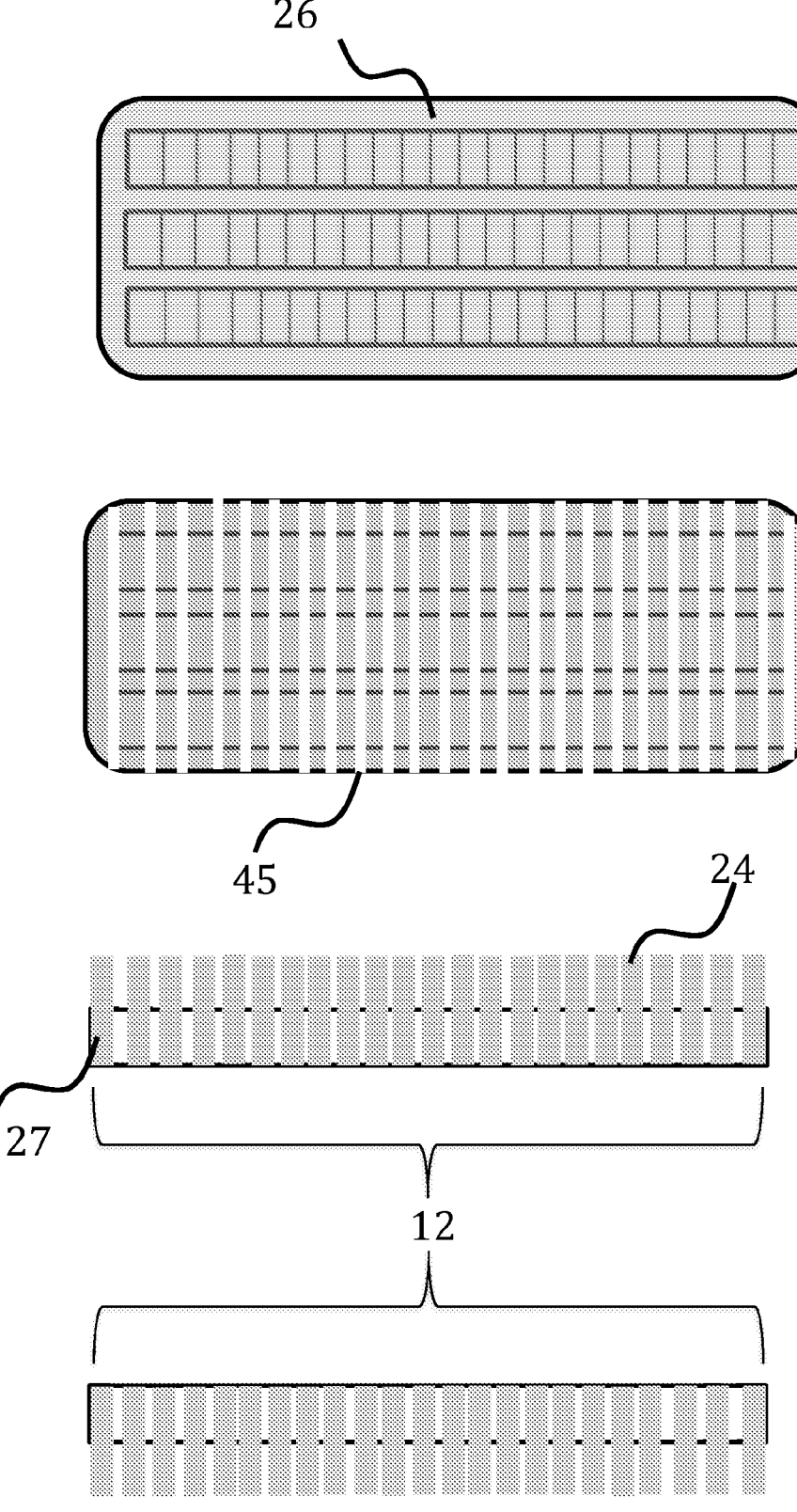
FIG. 4B is a plan view of transducers at various later stages of lithography.

As shown in FIG. 4B, a thin layer 47 of conductive material is deposited on the top and bottom of composite surfaces as electrodes 23, 25, as well as over the support 37. These layers may be added to the composite plate earlier on in the process, as is typically done with commercially available piezoelectric composite. Because the composite is not conductive, forms of electroless depositions are used to add the thin electrode layers, such as vacuum deposition (including physical/chemical vapor deposition, evaporation deposition and sputtering), electroless plating by immersion or adhesion of a foil sheet or thin wireframe. This layer 47 may be thin (i.e. 0.2 um to 3 um) and weak but the purpose is to form a bond between the composite and subsequent layers. The thin layer 47 may in practice comprise several sublayers or a continuously varying layer of different metal.

On top of the thin layers 47, a thick electrode layer 48 is added to provide strength and robustness at elevated temperatures and pressures. This layer forms electrode 26, extending beyond the composite stack to provide an electrode lead portion 24 which can then be connected to the flex circuit wires. The support 37 provides a ground to deposit and hold the extended portion, especially when the addressable elements are present or being formed.

Alternatively, the common electrode layer 23 is coated with an adhesive layer 28, preferably a conductive adhesive layer so that the common electrode may be easily contacted by a electric lead when assembled in the device. The common electrode may be 0.6 um thick and be provided with the composite.

Figures 7A, 7B:
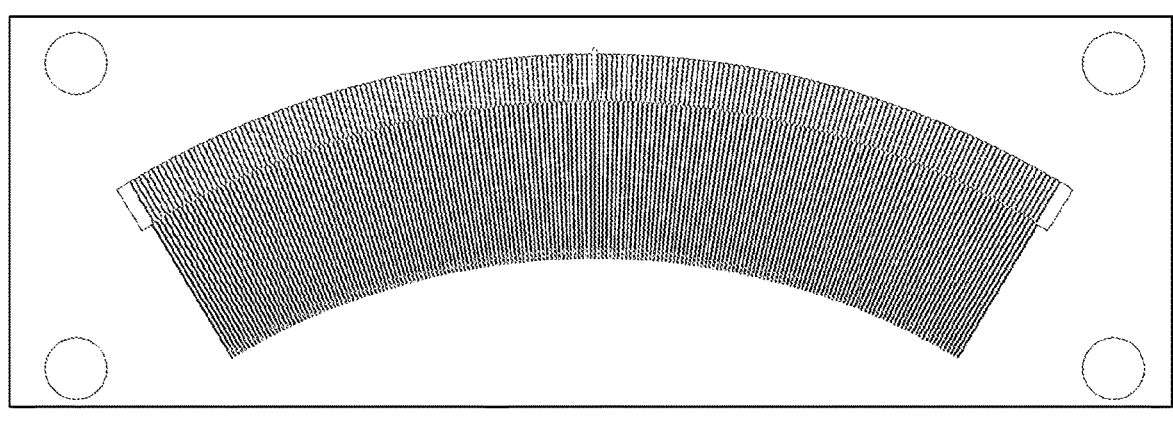
FIG. 7A is a plan view of a wireframe after dicing.
FIG. 7B is a close-up plan view of addressable electrodes after dicing.

The electrode layer 26 is either pre-formed with separate electrodes, each with extended portion 24, or they are formed after the layer coupling to the thin electrode. The middle step of FIG. 4B illustrates removing (by etching or dicing) areas 45, leaving intact electrodes 26 over each piezoelectric element. More preferably, electrodes 26 are patterned (by etching or ablation) to form extending portions 24 narrower than the portion 27 over the composite (see FIG. 7B). This narrowing creates more space between leads for ease of subsequent connecting to electrical leads or to create traces in a circuit (see below). For example, an array may have a pitch of 400 um with a mere 75 um separating transducer elements (and thus the electrode portion 27), making soldering or clamping very difficult. Thus the extending portions 24 may be narrowed to less than 150 um to create a separation of at least 250 um.

The number of transducer elements, their pitch, and driving frequency λ affect the imaging quality. In acoustic transducers, a useful rule is that the pitch should be in the range of λ/2 and λ to minimize grating lobes. Thus, in one embodiment, there may be 128 elements, spaced 300 μm (equal to λ) apart, driven at 5 MHz in water. In a very high-resolution array, the pitch may be 150 um.

The transducer arrays may be separated by removing the support (i.e. melting the wax or pulling away the frame), As shown in the last step of FIG. 4B, plural arrays 12 have been made in one batch. For rigidity, the extending portions may be connected together by a lateral 'backbone' portion 49, which will be cut off when connecting to electrical leads (see backbone 49 of FIG. 8).

A matching layer 21 is molded, ground, and shaped separately then bonded to the thick electrode 26. The plural arrays may then be removed from the support 37 and separated from each other.

The arrays are bonded to the backing layer after their formation. This flat stack is then shaped to match the shape of the housing of the device, typically a cone or ring. Leads from a flex-circuit are connected to individual extended portion by soldering or ultrasonic welding. A lens couples to the matching layer using a material chosen to have a similar impedance value as the fluid in the wellbore.

Figure 5:
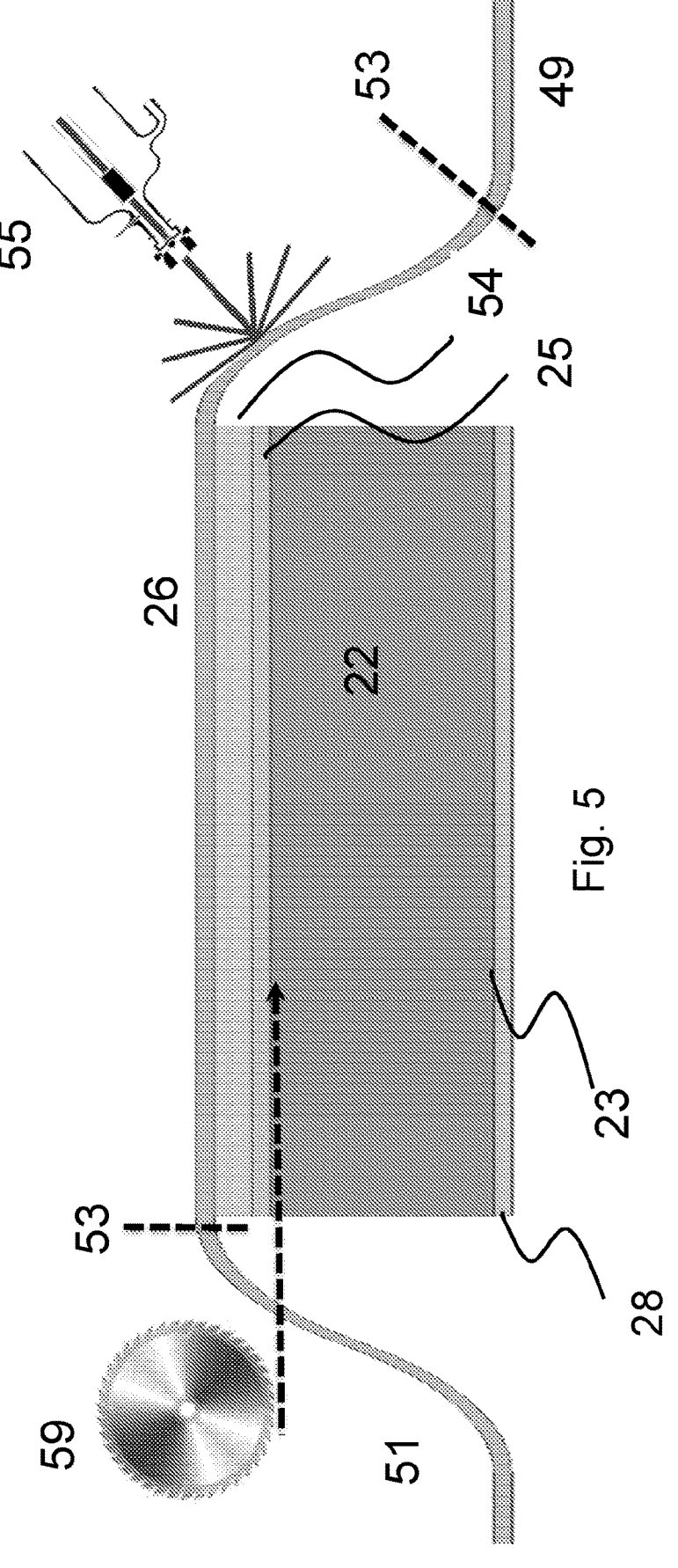
FIG. 5 is a side view of a transducer stack having a wireframe overlaid and diced.

Foil Lamination:

FIG. 5 provides a side of an array using a foil sheet for the electrode 26. Foil 51 is a thin, malleable metal sheet that is bonded to the top of the stack 23/22/25, preferably by conductive adhesive 54, with end portions that extend past the ceramic 22. The adhesive may comprise an epoxy, such as B-stage epoxies, and may contain silver or other conductive particles to electrically couple the thin electrode layer 25 to the foil 51. This may comprise 50-micron thick epoxy and 15-micron thick foil. Examples of suitable adhesives are Loctite™ Ablestik™ CF 3350, Mereco's™ Metacase™ 401 and Rogers Corporation's™ CoolSpan™ TECA film.

Figures 6A, 6B:
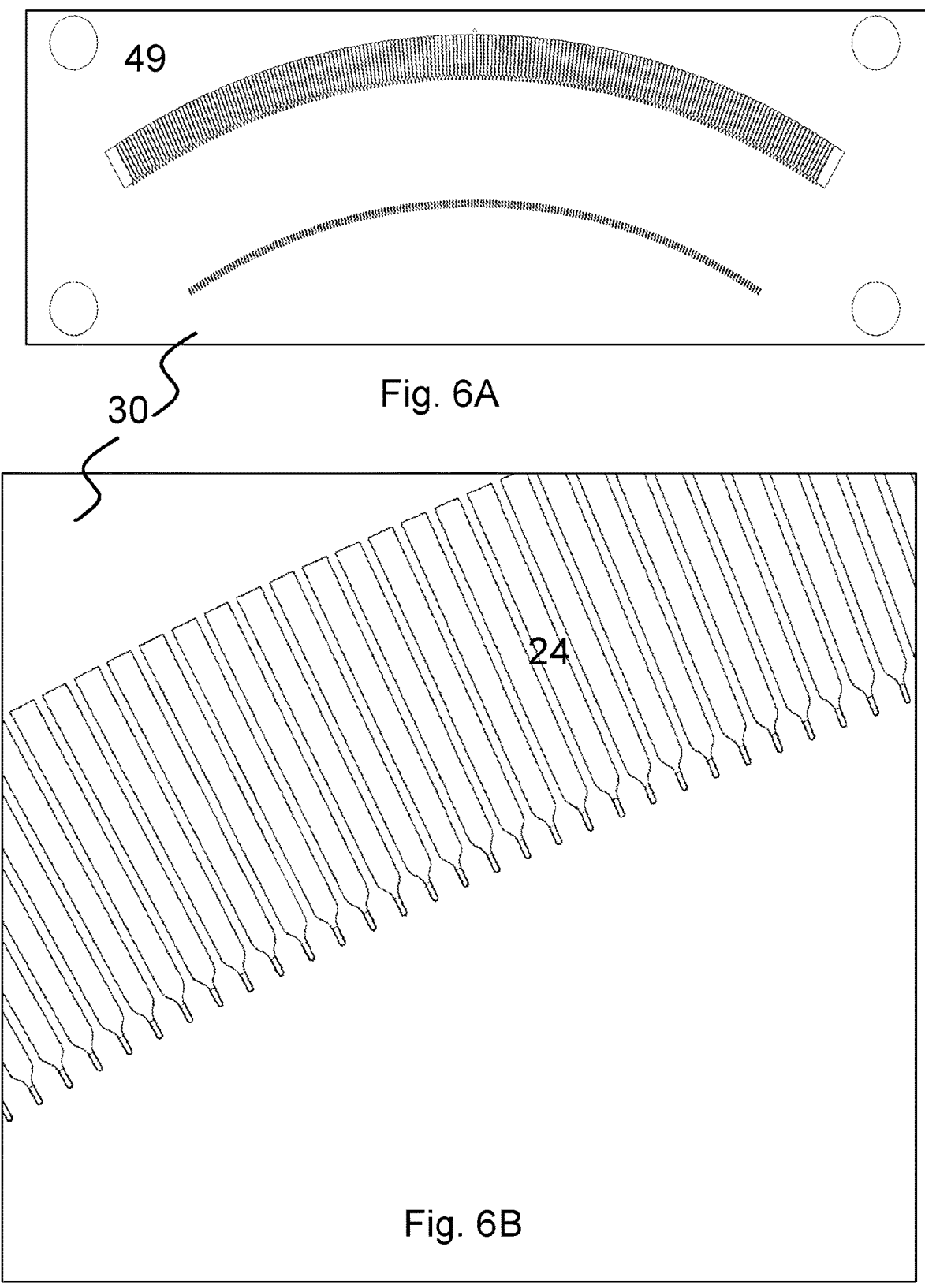
FIG. 6A is a plan view of a wireframe before dicing.
FIG. 6B is a close-up plan view of addressable electrodes before dicing.

The foil 51 may be have individual electrodes formed prior to bonding (similar to the wireframe shown in FIG. 6A). A common connector 49 provides a backbone to hold the elements together during assemble, which backbone is then removed as indicated at lines 53 by dicing or cutting after the electrodes are bonded.

Alternatively, the individual electrodes are formed in the foil after bonding, each electrode including a portion that extends beyond the composite. Electrodes may be formed by chemical etching, laser ablation or dicing. As shown in FIG. 5, laser 55 patterns electrodes through the overhanging ends of the foil by ablation. The overhanging portion may be supported by support shims (not shown) if needed during laser cutting. The foil 51 is diced by saw 59 to form individual thick electrodes/leads 26 that are thicker and stronger than the thin electrodes 25. During this step, kerfs are made thru layers 25, 26, 54 and a small amount into composite 22. The depth of the kerf may be 10-200 um. This separates the composite into separate transducer elements, individually addressable by the electrodes 26 bonded thereto.

Separate Wireframe

In a preferred embodiment, a wireframe 30 may be made separately and laid up on the diced composite with thin electrode 25. As shown in FIG. 6A/6B, a separately made wireframe 30 may comprise an array of pre-formed leads 24, connected together by backbone 49. The leads 24 are spaced and sized to align to each transducer element, which elements have been (or will be) created by dicing the composite. The end portion of each lead may be ultrasonically welded or soldered at an end of thin electrode 25.

This connection may be weak and affect the piezoelectric effect, but this may be minimized by connecting these ends with minimal overlap and then strengthening the connection by electroplating a thick conformal layer over the lead 24 and thin electrode 25. The wireframe and composite are placed in a copper ion bath with the cathode connected to backbone 49. The electroplated layer becomes thick electrode 26.

The wireframe is made from a layer of thin conductive material, such as 15-40 um copper foil. Prior to connection to the stack, undesired areas of the conductive material around the electrodes are removed, preferably by etching, cutting or laser ablation.

Figure 8:
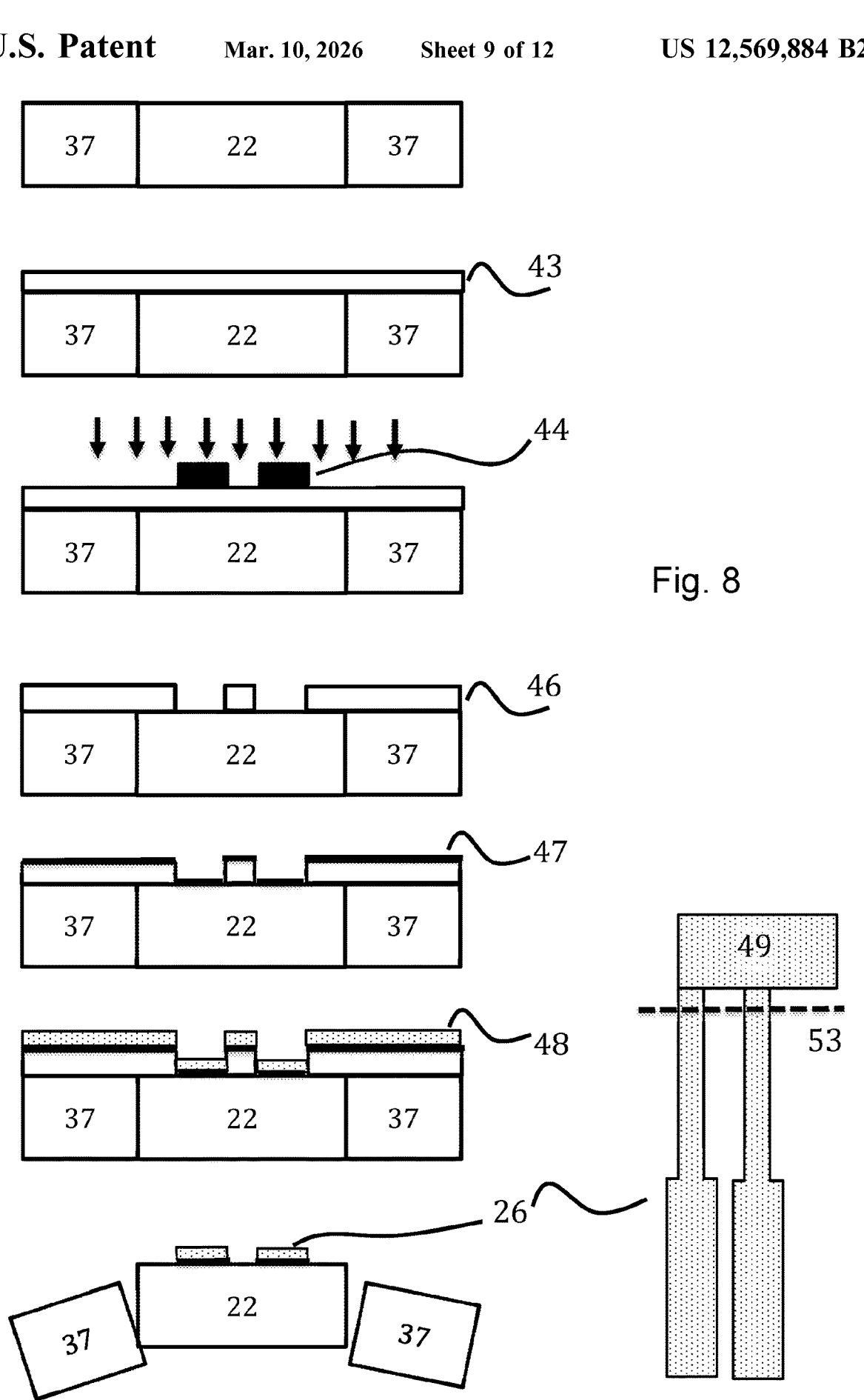
FIG. 8 is set of steps in a photolithographic process for a transducer.

Lithography:

The electrodes may also be created by additive photolithography, as illustrated by FIG. 8. Starting with the diced, epoxy-filled composite 22, a negative resist 43 is spin coated over the composite top surface 22 and support 37. Support 37 surrounds the composite to hold it in place and provides a substrate for building up the electrode extending portion 24. A clear-field mask 44 is placed over the composite through which UV lighting is applied to cure the resist selectively. The uncured areas define the areas that will be covered by electrode 25, which area may be patterned to include the wide electrode portion, narrow extended lead portion and backbone 49 joining together the leads. The uncured photoresist is then washed away with detergent, (e.g. 2% Tetramethylammonium hydroxide).

A thin metal layer 47 is electrolessly deposited, such as by vapor deposition over the extant resist, support and composite. The metal may be copper, chromium, gold or combination that can form some bond to the composite and support.

A thick metal layer 48 is electroplated to the thin metal layer 47 to create the full electrode 26. This thick metal layer 48 is conductively and mechanically coupled to the thin layer 47 and substantially covers layer 47 (over each electrode 25). Thus a voltage applied to the lead 24 energizes the whole electrode and the composite material beneath it and the uniform covering ensures that the wave is transmitted consistently through the metal layers. The backbone 49 may provide the electrical connection to the cathode in the electroplating bath, which contains metal ions, such as copper. It is preferable that the photoresist layer is sufficiently thicker than the electroplated layers 47, 48 so that the metal over the cured and uncured are not bridged. Similarly, the metal ion concentration and rate of electroplating should be sufficiently low that bridging doesn't occur between separate electrodes.

Acetone may be used to remove the cured photoresist, which also removes the thin and thick metal layers attached thereto. The complete stack with extending leads 24 is then removed from the support 37 for subsequent soldering to the circuit and cutting off of the backbone 49.

Single Electrode Layer

Figure 3:
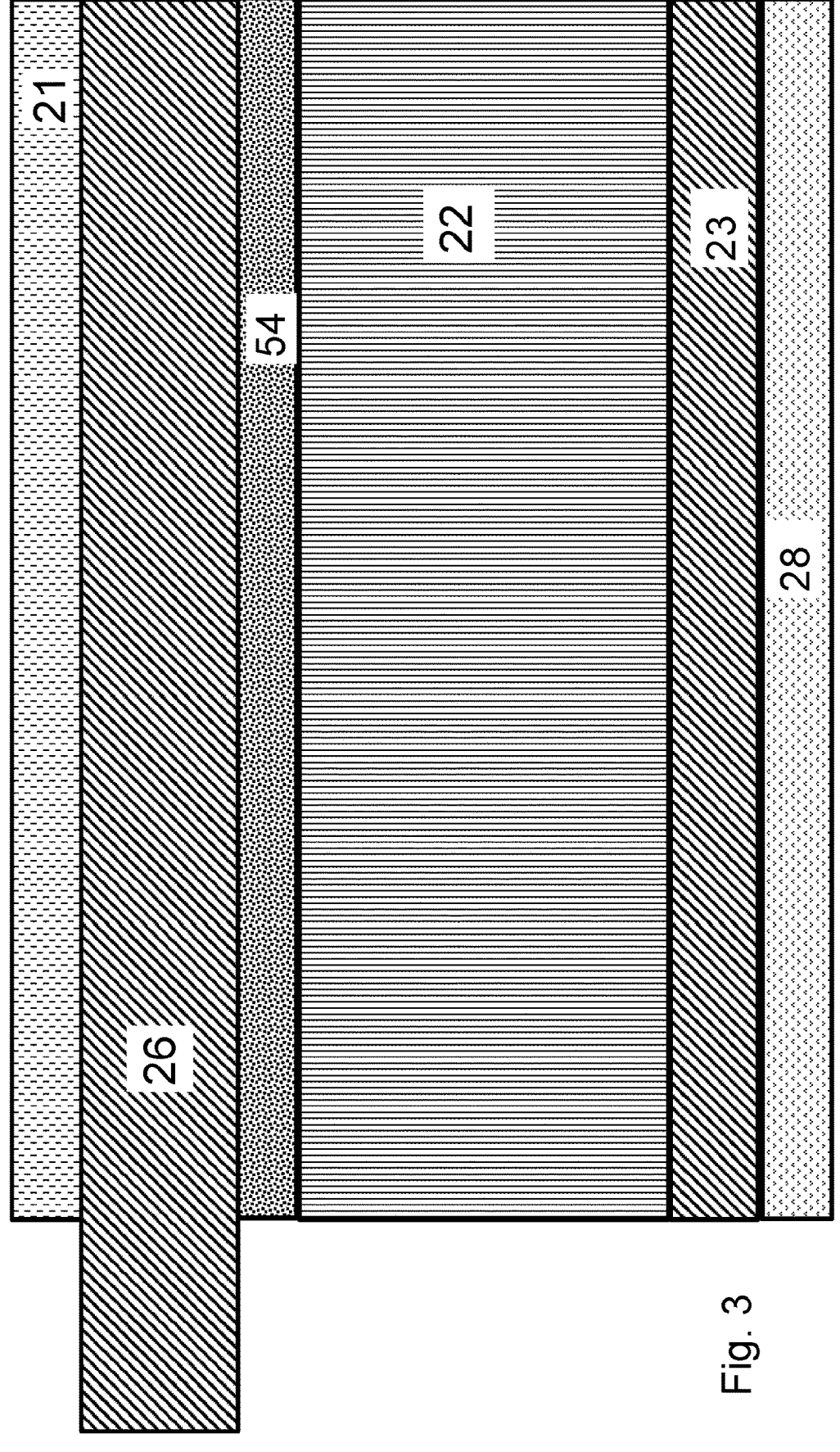
FIG. 3 is a cross-sectional view of a transducer stack according to an embodiment having a single metal layer addressable electrode.

In certain preferred embodiments the individual electrodes are formed as one layer 26 as shown in FIG. 3. Here thick layer 26 provides both the mechanical strength connecting the electrical leads to the transducer stack as well as providing a uniform layer through which the wave can travel. Metal layer 26 may be formed by electroless plating, vacuum deposition (VD) or using an adhesive layer 54 to bond a foil or wireframe directly to the top of the composite. In all cases, the electrode extends beyond the composite in the elevation direction to connect to individual leads of the circuit connector. The thickness of metal layer 26 may be 10-40 um.

Advantageously certain transducers made using this method will be simpler to make and provide a more consistent layer thru which waves can travel.

Curved Array

Figure 10A:
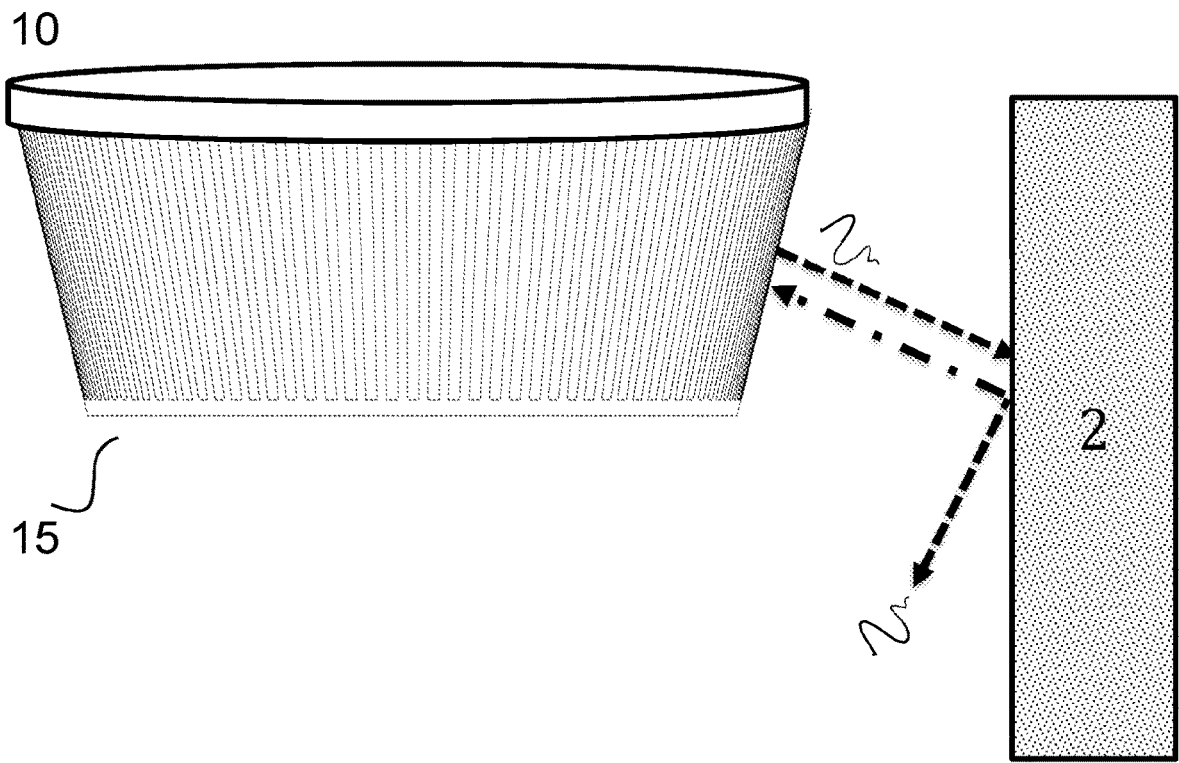
FIG. 10A is an illustration of a conical probe having a transducer array.
Figure 10B:
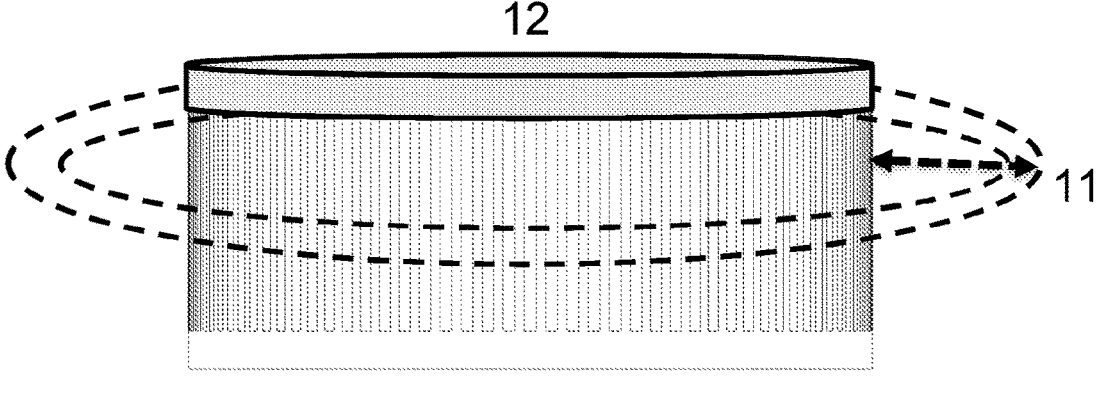
FIG. 10B is an illustration of a radial probe having a transducer array.

A conical radial transducer array arranges elements that face radial-outward and partially longitudinally (i.e. downhole or uphole) by laying the array backing on a frustoconical surface (see FIG. 10A). Creating such an array from a flat laminate structure presents certain geometric challenges. As shown in FIG. 6A a flat wireframe that is curved in the plane may be provided, which after the stack is created is then conformally shaped around the frustoconical mounting 15 of the device. The full circular array may be built from two or more curved sections to cover separate portions around the cone (e.g. 180° per section shown in FIG. 6A), which are then each wired to the flex circuit to act as single array.

In this case, dicing operations on the flat stack may be made by varying the relative angle of the dicing saw by fractions of a degree relative to the stack. This process preferably employs a jig for holding the stack and that is indexed at plural angle from −45° to +45°.

Circuit

The device comprises a circuit board, electrical components, and a terminal connectors. The terminal connectors may be a flex circuit with conductor traces connected to the extending portion 24 at an end distal from the composite stack. This circuit may have electrical components, signal conditional components, ADCs, drivers, processors. This advantageously locates certain electrical components as close as possible to the transducer, reducing introduction of additional noises and simplifying the connection to the remaining parts of the probe. Other components are located within a pressurized housing of the device to protect them from the extreme environmental conditions.

In one manufacturing embodiment, the circuit traces are laid down with the individual element electrodes, for example by lithography.

Applications

Figure 11:
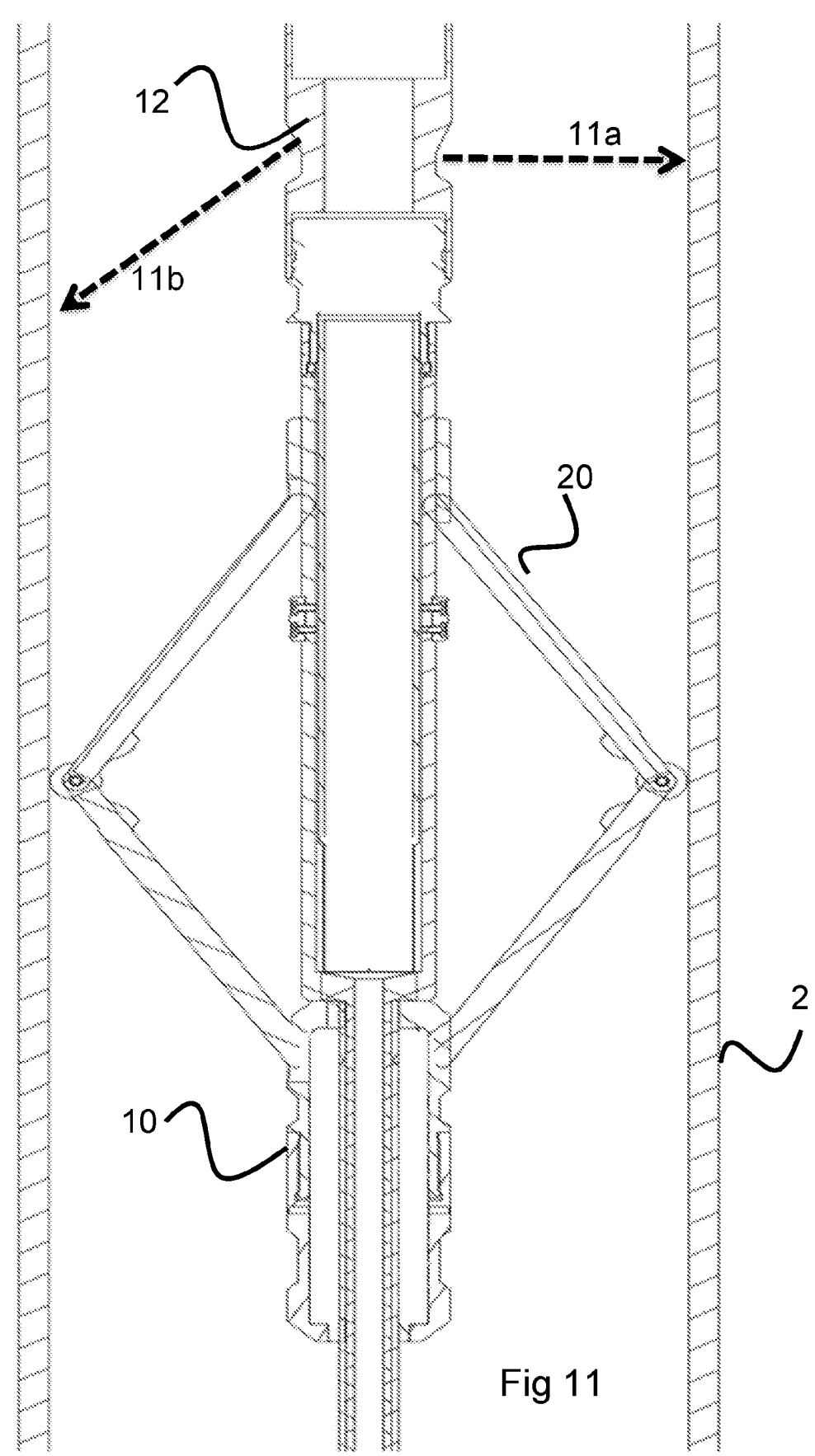
FIG. 11 is a cross-sectional view of a downhole acoustic probe in a tubular.

Transducers of the present composition and manufacture may be used in various probes, which are used in applications, such as medical examination, wells and pipelines. FIG. 11 depicts an imaging device used in well and pipe and comprising the transducer array, operable as a phased array. The present transducers have particular benefits in applications with great physical strains such as high pressures or high temperatures, which would normally break apart electrodes during use.

FIG. 11 illustrates an imaging device 10 deployable in a well or pipe 2. The imaging device 10 generally comprises at least one ultrasound transducer 12 and optionally one or more centralizers 20. Well or pipe 2 may be used to transport or access water, oil or gas. This term is intended to include cased wells, uncased wells, open holes, boreholes, water pipelines, oil pipelines, tubing, and boiler tubes.

As shown in FIG. 10A/10B, the radial transducer is a 1D array of transducer elements 12 separated radially around the body of the device. The geometry of the transducer (including any lens and reflector) directs a pulse outward to sonify the surface of the well, pipe or manufactured part.

When the array faces the purely radial direction, known as a thickness probe, the reflections indicate the distance to surfaces and defects in the walls. When the radial array is formed on a frustoconical surface, at a cone angle of 20-40°, the wavefront is directed partially toward the longitudinal axis and reflects surface and depth features from a focused spot.

While the devices and method above have been explained for the sake of clarity using certain models and scientific theory, the invention is not limited by the correctness of those theories or to embodiments that comply with those theories.

Terms such as "top", "bottom", "distal", "proximate" "adjacent", "below," "above," "upper," are used herein for simplicity in describing relative positioning of elements of the transducer stack, as depicted in the drawings or with reference to the surface datum. Although the present invention has been described and illustrated with respect to preferred embodiments and preferred uses thereof, it is not to be so limited since modifications and changes can be made therein which are within the full, intended scope of the invention as understood by those skilled in the art.

The invention claimed is:

1. An acoustic transducer array comprising:
a piezoelectric composite;
a first metal layer on a first side of the piezoelectric composite defining a common electrode;
a second metal layer on a second side of piezoelectric composite, opposite the first side; and a third metal layer conductively connected to and substantially covering the second metal layer and extending beyond the piezoelectric composite in an elevation direction of the transducer,
wherein the third metal layer is thicker than the second metal layer and
wherein the second and third layers are formed to define a plurality of individual electrodes.

2. The array of claim 1, wherein the third metal layer is one of: an electrodeposited foil, a rolled foil, and an electroplated layer.

3. The array of claim 1, further comprising an adhesive between the second and third metal layers.

4. The array of claim 1, further comprising a matching layer covering the individual electrodes.

5. The array of claim 1, further comprising a backing layer covering the common electrode.

6. The array of claim 1, wherein the second metal layer has a thickness between 0.2 urn and 3 μm and preferably wherein the individual electrodes have a thickness between 15 μm and 40 um.

7. The array of claim 1, wherein the metal layers comprise one or more of: copper, gold, nickel, and silver.

8. The array of claim 1, wherein a portion of the individual electrodes located above the composite is wider than a width of the extending portion.

9. An acoustic transducer array comprising:
a piezoelectric composite;
a first metal layer on a first side of the piezoelectric composite defining a common electrode;
a second metal layer on a second side of the piezoelectric composite, opposite the first side, wherein the second metal layer, on a per element basis, extends beyond the piezoelectric composite in an elevation direction of the transducer and is formed to define a plurality of individual electrodes,
wherein the common electrode is common among the plurality of individual electrodes.

10. The array of claim 9, further comprising an adhesive between the second metal layer and the second side of the piezoelectric composite.

* * * * *